(12) United States Patent
Husain et al.

(10) Patent No.: US 11,488,852 B2
(45) Date of Patent: Nov. 1, 2022

(54) METHODS AND APPARATUS FOR REDUCING HIGH VOLTAGE ARCING IN SEMICONDUCTOR PROCESS CHAMBERS

(71) Applicant: APPLIED MATERIALS, INC., Santa Clara, CA (US)

(72) Inventors: Anwar Husain, Pleasonton, CA (US); Hamid Noorbakhsh, Oakland, CA (US); Kartik Ramaswamy, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 422 days.

(21) Appl. No.: 15/930,562

(22) Filed: May 13, 2020

(65) Prior Publication Data

US 2020/0381282 A1    Dec. 3, 2020

Related U.S. Application Data

(60) Provisional application No. 62/855,037, filed on May 31, 2019.

(51) Int. Cl.
*H01L 21/683* (2006.01)
*H01J 37/32* (2006.01)
*H01L 21/67* (2006.01)

(52) U.S. Cl.
CPC .... *H01L 21/6833* (2013.01); *H01J 37/32715* (2013.01); *H01L 21/67069* (2013.01); *H01J 2237/334* (2013.01); *H01L 21/6831* (2013.01)

(58) Field of Classification Search
CPC ................. H01L 21/6831; H01L 21/6833
See application file for complete search history.

(56) References Cited

U.S. PATENT DOCUMENTS

| | | | |
|---|---|---|---|
| 5,847,918 A * | 12/1998 | Shufflebotham | H01L 21/6833 279/128 |
| 6,023,405 A | 2/2000 | Shamouilian et al. | |
| 6,414,834 B1 | 7/2002 | Weldon et al. | |
| 6,494,958 B1 * | 12/2002 | Shamouilian | C23C 16/4586 156/345.43 |
| 6,847,516 B2 | 1/2005 | Kwon et al. | |
| 8,968,503 B2 | 3/2015 | Hart et al. | |
| 9,218,997 B2 | 12/2015 | Jun et al. | |
| 2005/0016465 A1 * | 1/2005 | Ramaswamy | H01L 21/6833 118/728 |

(Continued)

*Primary Examiner* — Gary A Nash
(74) *Attorney, Agent, or Firm* — Moser Taboada

(57) ABSTRACT

Methods and apparatus for preventing or reducing arcing of an electrostatic chuck in a process chamber. In some embodiments, a method of preventing or reducing arcing of an electrostatic chuck includes forming a first recess in at least a portion of a sidewall of the electrostatic chuck and filling the first recess with a conformable dielectric material that remains conformable (elastic) over a temperature range of at least approximately zero degrees Celsius to approximately 80 degrees Celsius. In some embodiments, the first recess is filled with the conformable dielectric material such that the conformable dielectric material does not bond to at least one surface of the first recess. The conformable dielectric material may also be used to fill a second recess in a dielectric sleeve adjacent to the electrostatic chuck.

20 Claims, 4 Drawing Sheets

(56) References Cited

U.S. PATENT DOCUMENTS

| | | | |
|---|---|---|---|
| 2016/0035610 A1* | 2/2016 | Park | H01L 21/6833 165/80.2 |
| 2016/0064264 A1* | 3/2016 | Kulshreshtha | H01L 21/6833 438/791 |
| 2018/0277412 A1* | 9/2018 | Kimball | H01J 37/32715 |

* cited by examiner

METHODS AND APPARATUS FOR REDUCING HIGH VOLTAGE ARCING IN SEMICONDUCTOR PROCESS CHAMBERS

CROSS-REFERENCE TO RELATED APPLICATIONS

This application claims benefit of U.S. provisional patent application Ser. No. 62/855,037, filed May 31, 2019 which is herein incorporated by reference in its entirety.

FIELD

Embodiments of the present principles generally relate to semiconductor processing.

BACKGROUND

A plasma process is often performed in vacuum by evacuating gas from a processing chamber. In such a process, a substrate is placed on an electrostatic chuck (ESC) that is arranged on a stage of the processing chamber. The electrostatic chuck includes a conductive sheet-type chuck electrode that is arranged between dielectric members. When performing a plasma process, a voltage from a direct current voltage source is applied to the electrostatic source so that the substrate is chucked to the electrostatic chuck by a Coulomb force generated from the voltage application. The inventors have found that the high electric fields applied to the ESC may discharge and arc to adjacent assemblies, destroying the ESC in the process. Accordingly, the inventors have provided improved methods and apparatus for reducing high voltage arcing during processing of the substrate.

SUMMARY

Methods and apparatus for reducing high voltage arcing during semiconductor processing are provided herein.

In some embodiments, a method of reducing or preventing arcing of an electrostatic chuck comprises forming a first recess in at least a portion of a sidewall of the electrostatic chuck and filling the first recess with a conformable dielectric material that remains conformable over a temperature range of at least approximately −55 degrees Celsius to approximately 300 degrees Celsius.

In some embodiments, the method may further comprise filling the first recess with the conformable dielectric material such that the conformable dielectric material does not bond to at least one surface of the first recess; wherein the first recess is approximately 10 mils to approximately 120 mils in depth; wherein the conformable dielectric material is silicone; forming the first recess with a notch that extends a top surface of a conductive plate of the electrostatic chuck while maintaining insulative electrical properties of the conformable dielectric material on the at least the portion of the sidewall of the electrostatic chuck; forming a second recess in at least a portion of a sidewall of a component that is adjacent to the sidewall of the electrostatic chuck when installed in a process chamber, wherein the second recess overlaps a portion of the first recess when the electrostatic chuck and the assembly are installed in the process chamber; and filling the second recess with the conformable dielectric material; filling the second recess with the conformable dielectric material such that the conformable dielectric material does not bond to at least one surface of the first recess or the second recess; and/or wherein the second recess is approximately 10 mils to approximately 120 mils in depth.

In some embodiments, an apparatus for reducing or preventing arcing in a substrate support comprises a first conductive barrier for electrically insulating at least a portion of a sidewall of an electrostatic chuck, the first conductive barrier formed from a first dielectric material with a viscosity that readily conforms to a first recess in the sidewall of the electrostatic chuck, wherein the first dielectric material becomes stable when cured and forms a first conformable dielectric layer on the sidewall of the electrostatic chuck without bonding to at least one surface of the first recess in the sidewall of the electrostatic chuck; wherein the first dielectric material remains conformable after curing for temperatures from at least approximately −55 degrees Celsius to approximately 300 degrees Celsius; wherein the first dielectric material has a capability to fill the first recess to a level of 10 mils to 120 mils in depth; wherein the first dielectric material is silicone; a second conductive barrier for electrically insulating at least a portion of a sidewall of a dielectric sleeve that is adjacent to the electrostatic chuck when installed in a process chamber, the second conductive barrier formed from a second dielectric material with a viscosity that readily conforms to a second recess in the sidewall of the dielectric sleeve, wherein the second dielectric material becomes stable when cured and forms a second conformable dielectric layer on the sidewall of the dielectric sleeve without bonding to at least one surface of the second recess in the sidewall of the dielectric sleeve; wherein the second dielectric material remains conformable after curing for temperatures from at least approximately −55 degrees Celsius to approximately 300 degrees Celsius; wherein the second dielectric material has a capability to fill the second recess to a level of 10 mils to 120 mils in depth; wherein the second dielectric material is silicone; and/or wherein a thickness of the first conductive barrier is different than a thickness of the second conductive barrier.

In some embodiments, an apparatus for reducing or preventing arcing in a substrate support comprises a gasket with a tube-like structure with a hollow center and high compliance when under compressive forces, the tube-like structure composed of a conformable dielectric material that remains conformable between at least approximately −55 degrees Celsius to approximately 300 degrees Celsius and with a dielectric constant greater than air.

In some embodiments, the apparatus may further include wherein the gasket has an annular shape capable of surrounding an electrostatic chuck when installed in a process chamber; and/or wherein the gasket is capable of being inserted between a dielectric sleeve of the substrate support and an edge electrode assembly of the substrate support.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

Figure 1:
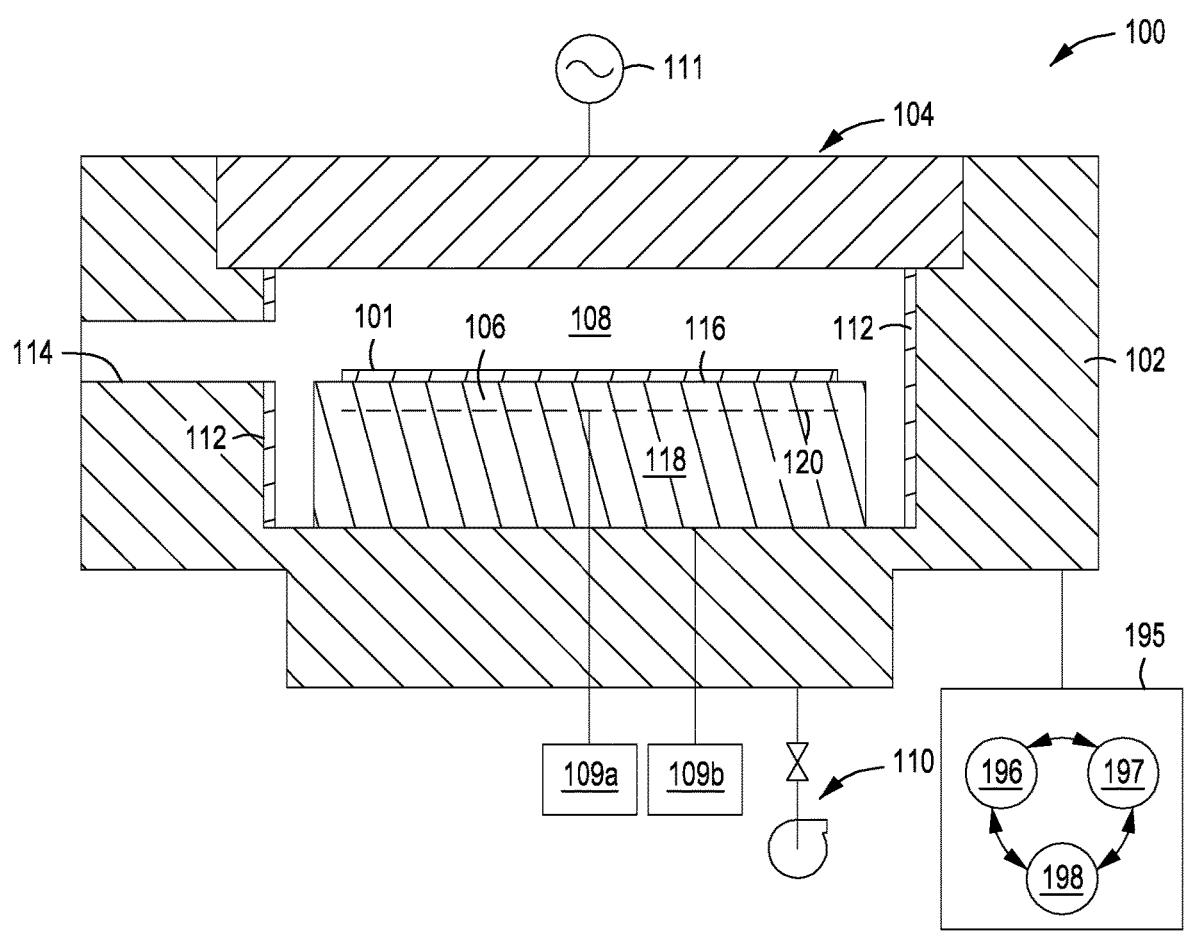
FIG. 1 is a cross-sectional view of a processing chamber in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods and apparatus facilitate in reducing and/or preventing unwanted arcing and plasma ignition between parts and/or assemblies of a semiconductor process chamber. In some embodiments, a conformal dielectric material is used to prevent exposure of an RF hot metal base of an electrostatic chuck (ESC), especially high electric field corners and interfaces to plasma and grounded areas such as, for example, skirt and/or baffle interfaces around the ESC cathode. The very high electric fields at the corners and bonded interfaces are potential areas for discharge and arcing to adjacent grounded areas. Any discharge, especially during high power pulsing, will destroy an expensive ESC. The conformal dielectric material provides an insulator that covers the areas without any gaps that may provide a precursor to light up and subsequent arcing. In some designs, an ESC base and bonded interfaces are anodized or plasma sprayed with a coating such as, for example, $Al_2O_3$, $Y_2O_3$, etc. that may have small porosities and/or microcracks that yield an overall smaller voltage breakdown. The conformal dielectric material of the present principles provides a potted or molded insulator that leaves no gaps around an RF hot conductor base of the ESC, reducing or eliminating arcing and/or local light ups. By encapsulating the conductive base of the ESC with conformal dielectric material, the chances of arcing to ground is reduced or eliminated. In some embodiments, a dielectric sleeve is also potted with a conformal dielectric material near high electric field areas of the ESC base. The conformal dielectric material is potted or molded without any cavitation around the base of a ceramic electrode of the ESC to cover the bond interface. The conformal dielectric material on the ESC base and the dielectric sleeve overlap to provide complete protection of the ESC base.

In some embodiments, the conformal dielectric material may be used to close variable gaps and line of sights between other high voltage (HV) assemblies and grounded assemblies in a semiconductor processing chamber. The inventors have found that electrical discharges to adjacent grounded assemblies and plasma light ups have caused major damage to the semiconductor processing chamber components. In some embodiments of a semiconductor processing chamber, the HV cathode and grounded baffle assemblies overlap each other to bring a secondary electrode closer to the wafer or a ground baffle to control the plasma sheet over the wafer. Even though both assemblies are mounted to the same chamber chassis, the assemblies may have multiple layers of parts with tolerances that create a large variable gap between parts/assemblies. In some embodiments, an annular gasket made with a conformal dielectric material and having a highly compliant structure such as, for example, a hollow tube, may be used to fill the large variable gaps and the line of sight between RF hot assemblies/parts and ground. The filled variable gap areas close the line of sight for arcing discharge from HV RF components to ground while filling the area in the gap to prevent plasma light ups. In some embodiments, compliant silicone tubes spread when compressed and fill the gap between the two assemblies/parts.

FIG. 1 is a cross sectional view of a processing chamber 100 in accordance with some embodiments. As shown, the processing chamber 100 is an etch chamber suitable for etching a substrate, such as substrate 101. Examples of processing chambers which benefit from aspects described herein are available from Applied Materials, Inc., located in Santa Clara, Calif. Other processing chambers, including those from other manufacturers, may be adapted to benefit from aspects of the disclosure. In some embodiments, the processing chamber 100 includes a chamber body 102, a gas distribution plate assembly 104, and a substrate support 106. The chamber body 102 of the processing chamber 100 includes or may be formed from one or more process-compatible materials, such as aluminum, anodized aluminum, nickel plated aluminum, nickel plated aluminum 6061-T6, stainless steel, as well as combinations and alloys thereof, for example. The substrate support 106 functions as an electrode in conjunction with the gas distribution plate assembly 104. As such, a plasma may be formed in a processing volume 108 defined between the gas distribution plate assembly 104 and an upper surface of the substrate support 106. As discussed in more detail below, the substrate support 106 includes or is formed of a conductive material, such as aluminum, a ceramic material, or a combination of both. The chamber body 102 also is coupled to a vacuum system 110 that includes a pump and a valve, and a liner 112 may be disposed on surfaces of the chamber body 102 in the processing volume 108. The chamber body 102 includes a port 114 formed in a sidewall thereof. The port 114 is selectively opened and closed to allow access to the interior of the chamber body 102 by a substrate handling robot (not shown). In such an embodiment, a substrate 101 is transferred in and out of the processing chamber 100 through the port 114. The substrate 101 is positioned on the upper surface 116 of the substrate support 106 for processing. Lift pins (not shown) may be used to space the substrate 101 away from the upper surface of the substrate support 106, such as to enable exchange with the substrate handling robot during substrate transfer.

The gas distribution plate assembly 104 is positioned on the chamber body 102. A power source 111, such as a radio frequency (RF) power source, is coupled to gas distribution plate assembly 104 to electrically bias the gas distribution plate assembly 104 relative to the substrate support 106 to facilitate plasma generation within the processing chamber 100. The substrate support 106 includes an electrostatic chuck 118, in which the electrostatic chuck 118 may be connected to a power source 109a to facilitate chucking of the substrate 101 and/or to influence a plasma located within the processing volume 108. The power source 109a includes a power supply, such as a DC or RF power supply, and is connected to one or more electrodes 120 of the electrostatic chuck 118. A bias source 109b may additionally or alternatively be coupled with the substrate support 106 to assist with plasma generation and/or control, such as to an edge ring assembly. The bias source 109b may illustratively be a source of up to about 1000 W (but not limited to about 1000 W) of RF energy at a frequency of, for example, approximately 13.56 MHz, although other frequencies and powers may be provided as desired for particular applications. The bias source 109b is capable of producing either or both of continuous or pulsed power. In some aspects, the bias source may be capable of providing multiple frequencies, such as 13.56 MHz and 2 MHz.

The processing chamber 100 may also include a controller 195. The controller 195 includes a programmable central processing unit (CPU) 196 that is operable with a memory 197 and a mass storage device, an input control unit, and a display unit (not shown), such as power supplies, clocks, cache, input/output (I/O) circuits, and the liner, coupled to the various components of the processing system to facilitate control of the substrate processing. To facilitate control of the processing chamber 100 described above, the CPU 196 may be one of any form of general purpose computer processor that can be used in an industrial setting, such as a programmable logic controller (PLC), for controlling various chambers and sub-processors. The memory 197 is coupled to the CPU 196 and the memory 197 is non-transitory and may be one or more of random access memory (RAM), read only memory (ROM), floppy disk drive, hard disk, or any other form of digital storage, local or remote. Support circuits 198 are coupled to the CPU 196 for supporting the processor. Applications or programs for charged species generation, heating, and other processes are generally stored in the memory 197, typically as software routine. The software routine may also be stored and/or executed by a second CPU (not shown) that is remotely located from the processing chamber 100 being controlled by the CPU 196.

The memory 197 is in the form of computer-readable storage media that contains instructions, when executed by the CPU 196, to facilitate the operation of the processing chamber 100. The instructions in the memory 197 are in the form of a program product such as a program that implements the method of the present disclosure. The program code may conform to any one of a number of different programming languages. In one example, the disclosure may be implemented as a program product stored on a computer-readable storage media for use with a computer system. The program(s) of the program product define functions of the aspects (including the methods described herein). Illustrative computer-readable storage media include, but are not limited to: non-writable storage media (e.g., read-only memory devices within a computer such as CD-ROM disks readable by a CD-ROM drive, flash memory, ROM chips, or any type of solid-state non-volatile semiconductor memory) on which information is permanently stored; and writable storage media (e.g., floppy disks within a diskette drive or hard-disk drive or any type of solid-state random access semiconductor memory) on which alterable information is stored. Such computer-readable storage media, when carrying computer-readable instructions that direct the functions of the methods described herein, are aspects of the present disclosure.

Figure 2:
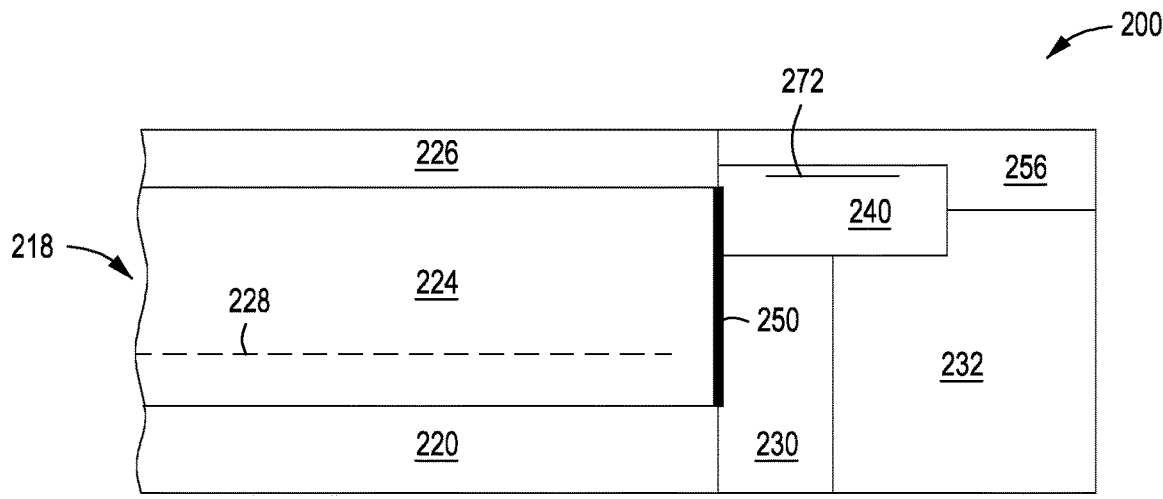
FIG. 2 is a cross-sectional view of a substrate support with an ESC insulator in accordance with some embodiments of the present principles.

FIG. 2 is a cross-sectional view of a substrate support 200 with a conformable dielectric layer 250 in accordance with some embodiments. The substrate support 200 is similar to, and may be used in place of, the substrate support 106. The substrate support 200 includes an electrostatic chuck 218 and a dielectric plate 220 arranged in a vertical stack, in which the electrostatic chuck 218 is positioned above the dielectric plate 220. The electrostatic chuck 218 includes a conductive plate 224 with a ceramic plate 226 positioned on top of the conductive plate 224. The ceramic plate 226 may include or be formed from a ceramic, such as silicon carbide or alumina. One or more electrodes 228, such as formed from a thin section of conductive material, are embedded in a ceramic or dielectric material of the conductive plate 224. A high voltage DC source may be coupled to the electrodes 228 to facilitate chucking of a substrate, and a bias RF source may be coupled to the conductive plate 224 through a matching network to power a cathode.

The substrate support 200 may further include a dielectric sleeve 230 and/or a baffle 232. The dielectric sleeve 230 may include or be formed from quartz and/or polytetrafluoroethene (PTFE), and is positioned about the electrostatic chuck 218 and about or within the dielectric plate 220. The dielectric sleeve 230 facilitates insulation of the electrostatic chuck 218. The baffle 232 is positioned about the dielectric sleeve 230. The baffle 232 may include or be formed from metal, such as aluminum, and may be electrically grounded. In one or more embodiments, a heater may be included within one or more components of the substrate support 200. For example, a heater may be included within the electrostatic chuck 218 to facilitate temperature control of the substrate. The heater may be positioned between the conductive plate 224 and the ceramic plate 226. The baffle 232 may additionally or alternatively include a heater. The heater may be, for example, a resistive heater, including one or more resistive heating elements.

In some embodiments, the substrate support 200 may include an edge electrode assembly 240. The edge electrode assembly 240 is positioned exterior to or about the electrostatic chuck 218 and includes an electrode 272. The electrode 272 includes or is formed from an electrically conductive material, such as metal. For example, the electrode 272 may be an electrically conductive wire or flattened ring, such as a foil. In one example, the electrode 272 may include or be formed from aluminum or copper. Further, the electrode 272 may be a flattened ring having a thickness of about 0.2 inches to about 0.4 inches. Power is supplied to the edge electrode assembly 240 and, in some embodiments, may be coupled to an adjustable RF source (for example, bias source 109b of FIG. 1) to transfer power to the edge electrode assembly 240. In another embodiment, the edge electrode assembly may be coupled to an external RF impedance tuning unit, or tunable load. In such an embodiment, the tuning unit may be used to adjust impedance at SRC RF frequency to vary plasma density distribution, used to adjust impedance at bias RF frequency to tune substrate edge plasma sheath, and/or coupled to ground and to locate ground closer to the substrate edge.

The substrate support 200, in some embodiments, may include an outer edge ring 256 that includes one or more silicon rings and one or more insulating rings, such as to facilitate coupling of a plasma (not shown) that is generated in the processing volume 108 of FIG. 1 above the substrate support 200 to the edge electrode assembly 240. Thus, with reference to FIGS. 1 and 2, a plasma is generated in the processing chamber 100 by the power source 111. The power source 109a may be coupled to the electrostatic chuck 218 to facilitate chucking of a substrate and/or to influence the plasma located within the processing volume 108 of the processing chamber 100. Further, the bias source 109b may be coupled to the edge electrode assembly 240 to facilitate plasma processing within the processing chamber 100. One or more circuits may be coupled to the edge electrode assembly 240 to affect the electrical properties of the electrode 272 included within the edge electrode assembly 240, thereby influencing the plasma, or a sheath of the plasma, adjacent a substrate. The plasma may be adjusted to result in more uniform processing of a substrate, thereby mitigating substrate edge non-uniformities.

In some embodiments, a conformable dielectric layer 250 is inserted between the conductive plate 224 of the electrostatic chuck 218 and the dielectric sleeve 230 and/or the edge electrode assembly 240. The inventors have found that arcing can occur between the conductive plate 224 of the electrostatic chuck 218 and other components when high electric fields are generated in the conductive plate 224 during semiconductor processing. In some embodiments, the baffle 232 is electrically grounded and an electrical field forms between the conductive plate 224 of the electrostatic chuck 218 and the baffle 232. Gaps that occur in the electrical field have a potential to cause arcing between components. The gaps may occur due to assembly tolerances and/or porosity of insulating coatings used on the various components. In addition, as the processing chamber 100 heat cycles during a process, the tolerances may increase due to heat expansion deformation, further exacerbating the arcing potential. For example, the dielectric sleeve 230 may be formed from a PTFE material. Although, the PTFE material provides an insulating function, the PTFE material is not elastic and will permanently deform during heat expansion, leaving gaps between the dielectric sleeve 230 and the conductive plate 224.

By providing the conformable dielectric layer 250 around the conductive plate 224 of the electrostatic chuck 218, the conformable dielectric layer 250 is able to constantly adjust to fill gaps due to tolerance gaps, coating porosity, or heat cycle issues, etc. between the electrostatic chuck 218 and other components such as the dielectric sleeve 230 and the edge electrode assembly 240. In some embodiments, the material used for the conformable dielectric layer 250 has a dielectric constant greater than or equal to PTFE (approximately 2.1) and remains conformable and resilient (elastic) in a temperature range of at least approximately zero degrees Celsius to approximately 80 degrees Celsius. In some embodiments, the material used for the conformable dielectric layer 250 remains conformable and resilient (elastic) in a temperature range of at least approximately −55 degrees Celsius to approximately 300 degrees Celsius. In some embodiments, the material may be a synthetic polymer such as, but not limited to, polysiloxane or silicone. In the substrate support 200, the conformable dielectric layer 250 provides an electrically insulating layer between the conductive plate 224 and the adjacent components. In some embodiments, the conformable dielectric layer 250 may have a thickness of approximately 10 mils to approximately 120 mils. In some embodiments, the conformable dielectric layer 250 not bonded to a surface and be a replaceable maintenance part of the processing chamber 100. The conformable dielectric layer 250 may be a pre-formed layer and/or may be potted or molded in situ. The conformable dielectric layer 250 conforms to the surfaces of adjacent components and maintains contact between the adjacent surfaces over a given temperature range (e.g., approximately −55 degrees Celsius to approximately 300 degrees Celsius) as the gaps between components change. The conformable dielectric layer 250 provides an alternative solution to moving a grounded baffle further away in an attempt to weaken the electric field between the electrostatic chuck 218 and the baffle 232. Moving the baffle 232 would also negatively impact the plasma field generated during processing of the substrate, affecting substrate uniformity.

Figure 3:
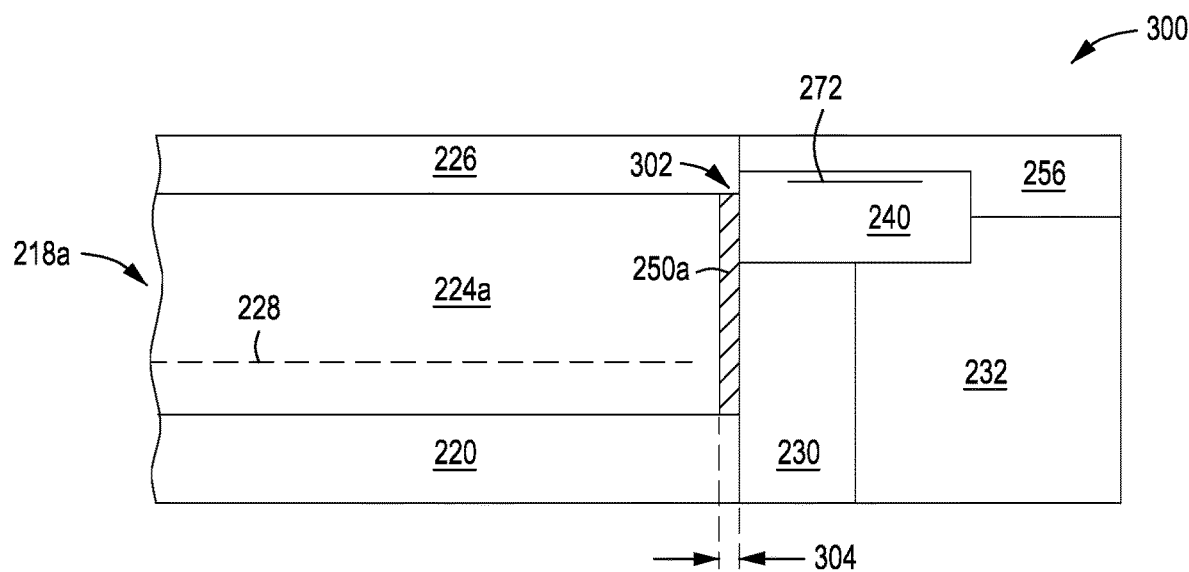
FIG. 3 is a cross-sectional view of a substrate support with a conformable dielectric layer in a recess of an ESC in accordance with some embodiments of the present principles.

In FIG. 3, a cross-sectional view of a substrate support 300 with a conformable dielectric layer 250a in a recess 302 of an ESC 218a in accordance with some embodiments is shown. In some embodiments, the recess 302 is created in a conductive plate 224a of the ESC 218a. The conformable dielectric layer 250a may be pre-formed and inserted into the recess 302 and/or may be potted or molded in situ into the recess 302. In some embodiments, the thickness 304 of the conformable dielectric layer 250a may be approximately 10 mils to approximately 120 mils. The inventors have found that for a potted or molded layer that is not bonded to a surface, a thickness of approximately 120 mils is preferred due to the increased rigidity rather than due to increased electrical insulative properties. As the thickness 304 is increased substantially beyond 120 mils, cooling of the ceramic plate 226 is compromised. The recess 302 formed into the electrostatic chuck 218 is preferred over creating a recess in the edge electrode assembly 240. A recess in the edge electrode assembly 240 would require that the electrode 272 to be moved further away from the edge of a substrate and would affect edge uniformity on the substrate during processing.

Figure 4:
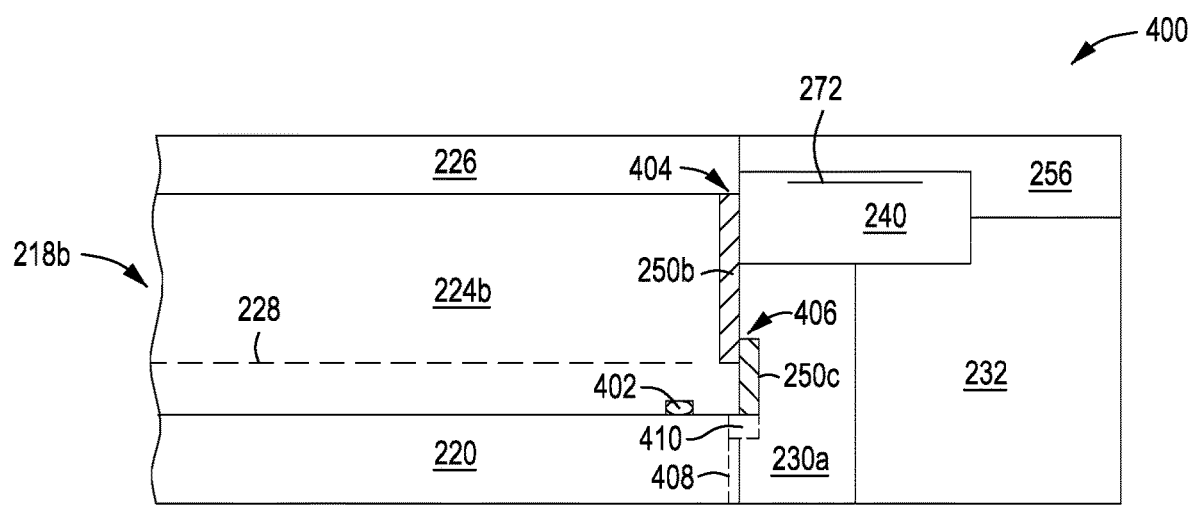
FIG. 4 is a cross-sectional view of a substrate support with a multiple portion conformable dielectric layer in accordance with some embodiments of the present principles.

FIG. 4 is a cross-sectional view of a substrate support 400 with a multiple portion conformable dielectric layer with a first portion 250b and a second portion 250c in accordance with some embodiments. In some embodiments, a conductive plate 224b of an electrostatic chuck 218b may have a conductive O-ring 402 around the lower peripheral edge of the conductive plate 224b. A first recess 404 in the conductive plate 224b may be created such that the first recess 404 does not extend to a bottom surface of the conductive plate 224b to allow clearance for the conductive O-ring 402. A second recess 406 is created in a dielectric sleeve 230a. In some embodiments, the first recess 404 and the second recess 406 may have overlapping portions. In some embodiments, the thickness of the first portion 250b and the second portion 250c of the multiple portion conformable dielectric layer 250b, 250c may be approximately the same or may be different thicknesses. For example, the second recess 406 in the dielectric sleeve 230a may be shorter in height and require a smaller thickness to maintain rigidity when not bonded to the dielectric sleeve 230a. In some embodiments, the dielectric sleeve 230a may encroach under 408 the conductive plate 224b and the second recess may also encroach under 410 the conductive plate 224b to fully cover any RF hot corners of the electrostatic chuck 218b.

Figure 5:
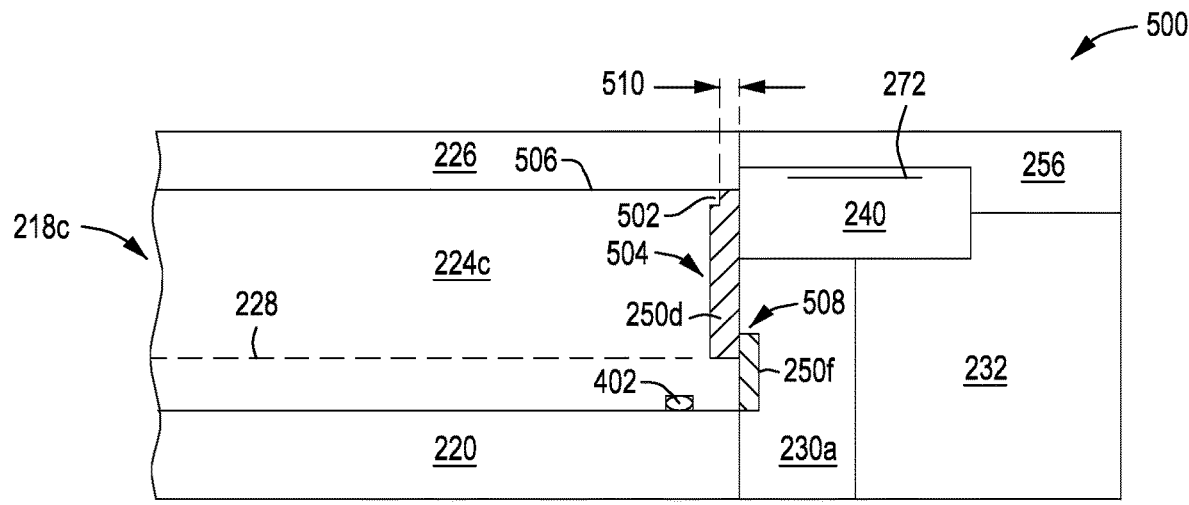
FIG. 5 is a cross-sectional view of a substrate support with another multiple portion conformable dielectric layer in accordance with some embodiments of the present principles.

In FIG. 5, a cross-sectional view of a substrate support 500 with another multiple portion conformable dielectric layer with a first portion 250d and a second portion 250f in accordance with some embodiments. A notch 502 may be formed in a first recess 504 to maximize a top surface 506 of the conductive plate 224c. The inventors have found that maximizing the top surface 506 of the conductive plate 224c provides for better temperature control of the ceramic plate 226 and subsequently provides better uniformity during processing of a substrate. A thickness 510 of the notch 502 is sufficient to provide electrical isolation while maximizing the top surface 506. Rigidity of the first portion 250d is maintained in the notch 502 due to the notch 502 comprising only a small portion of the first portion 250d. In some embodiments, the conductive plate 224c of an electrostatic chuck 218c may also have a conductive O-ring 402 around the peripheral edge of the conductive plate 224c. The first recess 504 in the conductive plate 224c may be created such that the first recess 504 does not extend to a bottom surface of the conductive plate 224c to allow for clearance of the conductive O-ring 402. A second recess 508 is created in a dielectric sleeve 230a. In some embodiments, the first recess 504 and the second recess 508 may have overlapping portions. In some embodiments, the thickness of the first portion 250d and the second portion 250f of the multiple portion conformable dielectric layer may be approximately the same thickness or may have different thicknesses. The second recess 508 in the dielectric sleeve 230a may be shorter in height and require a smaller thickness to maintain rigidity when not bonded to the dielectric sleeve 230a. One skilled in the art can appreciate that in some embodiments a single piece conformal dielectric layer over the conductive plate 224c may be used with the notch 502 and without the second recess 508 in the dielectric sleeve 230a (e.g., see FIG. 3).

Figure 6:
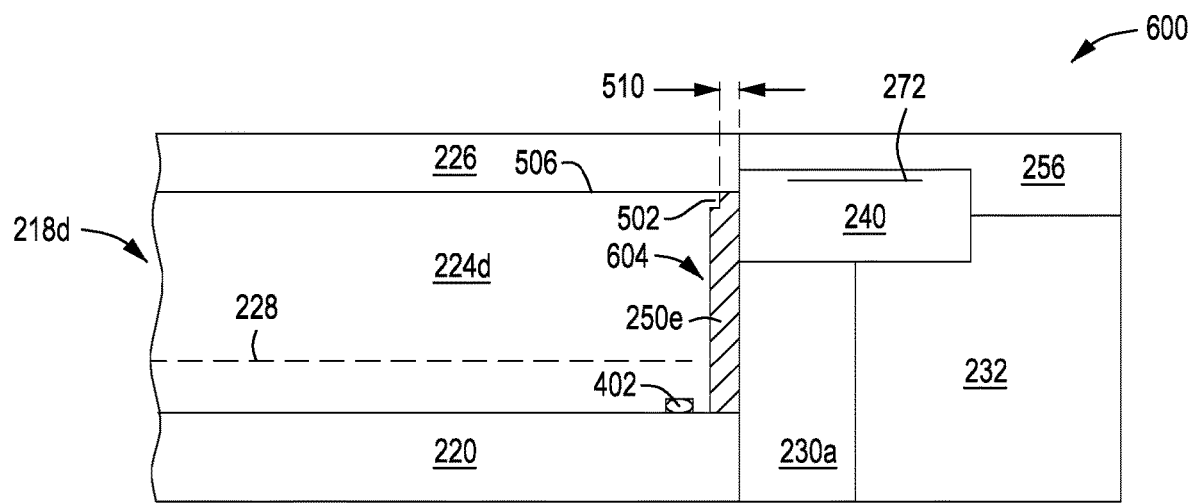
FIG. 6 is a cross-sectional view of a substrate support with another conformable dielectric layer in a recess of an ESC in accordance with some embodiments of the present principles.

FIG. 6 is a cross-sectional view of a substrate support 600 with another conformable dielectric layer 250e in a recess 604 of an electrostatic chuck in accordance with some embodiments. A notch 502 may be formed in the recess 604 to maximize a top surface 506 of the conductive plate 224d. As noted before, the inventors have found that maximizing the top surface 506 of the conductive plate 224d provides for better temperature control of the ceramic plate 226 and subsequently provides better uniformity during processing of a substrate. A thickness 510 of the notch 502 is sufficient to provide electrical isolation while maximizing the top surface 506. Rigidity of conformable dielectric layer 250e is maintained in the notch 502 due to the notch 502 comprising only a small portion of the conformable dielectric layer 250e. In some embodiments, the conductive plate 224d of an electrostatic chuck 218d may also have a conductive O-ring 402 around the peripheral edge of the conductive plate 224d. The recess 604 in the conductive plate 224d may be created such that the recess 604 extends to a bottom surface of the conductive plate 224d such that the recess 604 has clearance for the conductive O-ring 402 and protects the electrostatic chuck 218d with a single layer. One skilled in the art can appreciate that in some embodiments a single piece conformal dielectric layer over the conductive plate 224d may be used without the notch 502.

Figure 7:
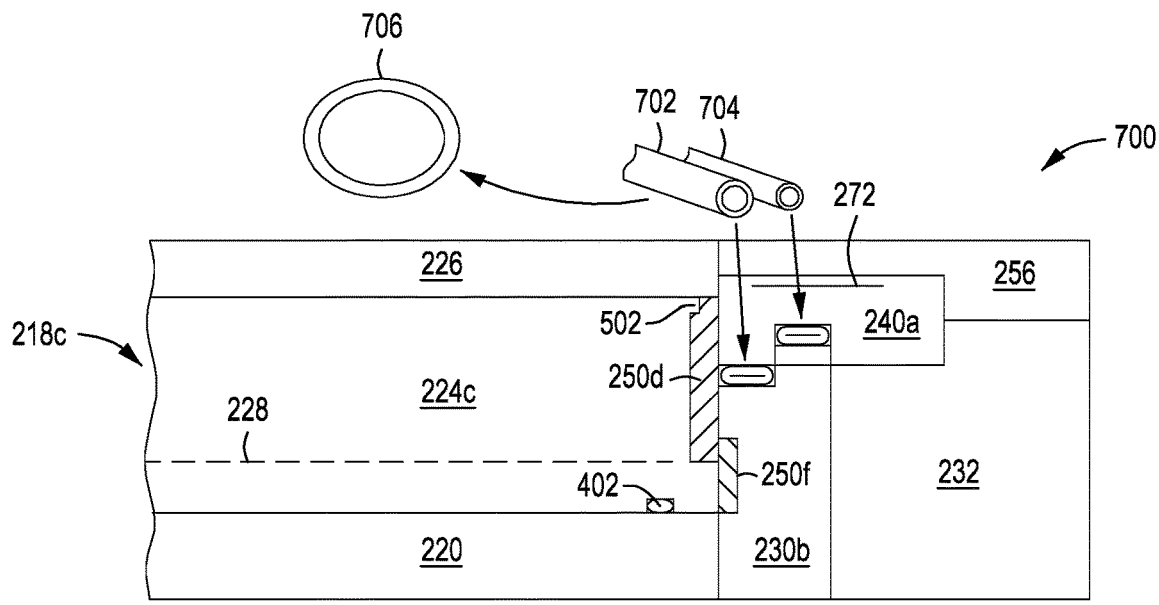
FIG. 7 is a cross-sectional view of a substrate support with conformable dielectric layers in a horizontal plane in accordance with some embodiments of the present principles.

FIG. 7 is a cross-sectional view of a substrate support 700 with conformable dielectric layers 702, 704 in a horizontal plane in accordance with some embodiments. The inventors have found that gaps may also occur between top and bottom surfaces of components as well as in adjacent surfaces of components. Tolerances and/or heat expansion/deformation of components with mating top and bottom surfaces may create or exacerbate gaps between the assemblies. The inventors have found that the structure of material to fill such gaps needs to be conformable and highly compliant. For example, the dielectric sleeve 230b of FIG. 7 has a top surface that interlocks with a bottom surface of an edge electrode assembly 240a. The gaps formed between the top and bottom surfaces may allow arcing to occur. Materials such as solid silicone, while providing conformable material was found to cause binding and ill-fitting parts due to the high compressive forces required to compress the solid silicone between components. The inventors discovered that if a tube-like structure formed from silicone was used, the conformability is maintained while the compressive forces are dramatically reduced, allowing components to easily lock into place while eliminating arcing between the assembly surfaces. One skilled in the art can appreciate that other structures may be used that have low compressive forces and are constructed of a material that is highly conformable. The conformable dielectric layers 702, 704 may be of different or the same diameters in cross section and/or may be the same or different diameters in overall annular shape 706. The annular shape 706 of the tube-like conformable dielectric layers 702, 704 allow the conformable dielectric layers 702, 704 to surround the electrostatic chuck 218c. The conformable dielectric layers 702, 704 may also be referred to as gaskets.

Figure 8:
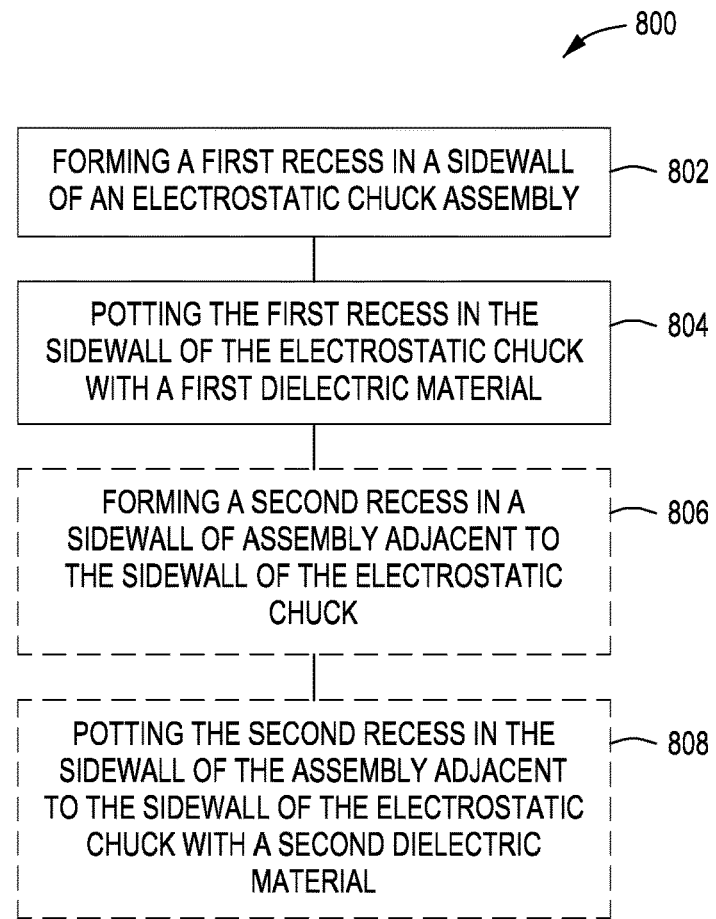
FIG. 8 is a method for potting a conformal dielectric layer in accordance with some embodiments of the present principles.

In FIG. 8, a method 800 for potting or molding a conformal dielectric layer in accordance with some embodiments is shown. In block 802, a first recess is formed in a sidewall of an electrostatic chuck assembly. As described above, the first recess may incorporate the entire sidewall or a portion of the sidewall. In addition, the first recess may be a consistent depth or may decrease in depth for a portion of the first recess (e.g., a notch, etc.). In block 804, a first dielectric material is then potted or molded in the recess in the sidewall of the electrostatic chuck to form a first conductive barrier. In some embodiments, the potting or molding is performed such that the first dielectric material is not bonded to surfaces of the first recess in the sidewall of the electrostatic chuck, allowing the first dielectric material to be removable. In optional block 806, an optional second recess is formed in a sidewall of an assembly adjacent to the sidewall of the electrostatic chuck when installed in a process chamber. In optional block 808, the optional second recess in the sidewall of the assembly adjacent to the sidewall of the electrostatic chuck when installed in the process chamber is potted or molded with a second dielectric material to form a second conductive barrier. In some embodiments, the potting or molding is performed such that the second dielectric material is not bonded to surfaces of the optional second recess in the sidewall of the assembly adjacent to the sidewall of the electrostatic chuck when installed in the process chamber, allowing the second dielectric material to be removable. The first and second dielectric materials may or may not be the same dielectric material. In some embodiments, the dielectric material may have a viscosity that readily conforms to a recess in a sidewall of the electrostatic chuck or other component and becomes stable and conformable (elastic) when cured in situ to form a conformable dielectric layer on the sidewall of the electrostatic chuck or other component without bonding to at least one surface of a recess in the sidewall of the electrostatic chuck or the other component.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. A method of reducing or preventing arcing of an electrostatic chuck, comprising:
   forming a first recess in at least a portion of a sidewall of the electrostatic chuck; and
   filling the first recess with a conformable dielectric material that remains conformable over a temperature range of at least approximately −55 degrees Celsius to approximately 300 degrees Celsius.

2. The method of claim 1, further comprising:
   filling the first recess with the conformable dielectric material such that the conformable dielectric material does not bond to at least one surface of the first recess.

3. The method of claim 1, wherein the first recess is approximately 10 mils to approximately 120 mils in depth.

4. The method of claim 1, wherein the conformable dielectric material is silicone.

5. The method of claim 1, further comprising:
   forming the first recess with a notch that extends a top surface of a conductive plate of the electrostatic chuck while maintaining insulative electrical properties of the conformable dielectric material on the at least the portion of the sidewall of the electrostatic chuck.

6. The method of claim 1, further comprising:
   forming a second recess in at least a portion of a sidewall of an assembly that is adjacent to the sidewall of the electrostatic chuck when installed in a process chamber, wherein the second recess overlaps a portion of the first recess when the electrostatic chuck and the assembly are installed in the process chamber; and
   filling the second recess with the conformable dielectric material.

7. The method of claim 6, further comprising:
   filling the second recess with the conformable dielectric material such that the conformable dielectric material does not bond to at least one surface of the first recess or the second recess.

8. The method of claim 6, wherein the second recess is approximately 10 mils to approximately 120 mils in depth.

9. An apparatus for reducing or preventing arcing in a substrate support, comprising:
   a first conductive barrier for electrically insulating at least a portion of a sidewall of an electrostatic chuck, the first conductive barrier formed from:
      a first dielectric material with a viscosity that readily conforms to a first recess in the sidewall of the electrostatic chuck, wherein the first dielectric material becomes stable when cured and forms a first conformable dielectric layer on the sidewall of the electrostatic chuck without bonding to at least one surface of the first recess in the sidewall of the electrostatic chuck.

10. The apparatus of claim 9, wherein the first dielectric material remains conformable after curing for temperatures from at least approximately −55 degrees Celsius to approximately 300 degrees Celsius.

11. The apparatus of claim 9, wherein the first dielectric material has a capability to fill the first recess to a level of 10 mils to 120 mils in depth.

12. The apparatus of claim 9, wherein the first dielectric material is silicone.

13. The apparatus of claim 9, further comprising:
   a second conductive barrier for electrically insulating at least a portion of a sidewall of a dielectric sleeve that is adjacent to the electrostatic chuck when installed in a process chamber, the second conductive barrier formed from:
      a second dielectric material with a viscosity that readily conforms to a second recess in the sidewall of the dielectric sleeve, wherein the second dielectric material becomes stable when cured and forms a second conformable dielectric layer on the sidewall of the dielectric sleeve without bonding to at least one surface of the second recess in the sidewall of the dielectric sleeve.

14. The apparatus of claim 13, wherein the second dielectric material remains conformable after curing for temperatures from at least approximately −55 degrees Celsius to approximately 300 degrees Celsius.

15. The apparatus of claim 13, wherein the second dielectric material has a capability to fill the second recess to a level of 10 mils to 120 mils in depth.

16. The apparatus of claim 13, wherein the second dielectric material is silicone.

17. The apparatus of claim 13, wherein a thickness of the first conductive barrier is different than a thickness of the second conductive barrier.

18. An apparatus for reducing or preventing arcing in a substrate support, comprising:
   a gasket with a tube-like structure with a hollow center and high compliance when under compressive forces, the tube-like structure composed of a conformable dielectric material that remains conformable between at least approximately −55 degrees Celsius to approximately 300 degrees Celsius and with a dielectric constant greater than air.

19. The apparatus of claim 18, wherein the gasket has an annular shape capable of surrounding an electrostatic chuck when installed in a process chamber.

20. The apparatus of claim 18, wherein the gasket is capable of being inserted between a dielectric sleeve of the substrate support and an edge electrode assembly of the substrate support.

* * * * *